United States Patent [19]

VanSlyke et al.

[11] Patent Number: 4,539,507
[45] Date of Patent: Sep. 3, 1985

[54] ORGANIC ELECTROLUMINESCENT DEVICES HAVING IMPROVED POWER CONVERSION EFFICIENCIES

[75] Inventors: Steven A. VanSlyke; Ching W. Tang, both of Rochester, N.Y.

[73] Assignee: Eastman Kodak Company, Rochester, N.Y.

[21] Appl. No.: 478,938

[22] Filed: Mar. 25, 1983

[51] Int. Cl.$^3$ .................................................. H01J 1/62
[52] U.S. Cl. ..................................... 313/504; 313/509; 252/301.21; 252/301.28; 357/8
[58] Field of Search ................ 313/498, 499, 503, 504, 313/506, 509; 252/511, 301.16, 301.21, 301.27, 301.28; 357/8, 61; 428/515

[56] References Cited

U.S. PATENT DOCUMENTS

| | | | |
|---|---|---|---|
| 3,173,050 | 3/1965 | Gurnee ............................ | 313/108 |
| 3,214,622 | 10/1965 | D'Errico et al. .................. | 313/108 |
| 3,267,318 | 4/1966 | Lynch et al. ..................... | 313/108 |
| 3,393,337 | 7/1968 | Panerai et al. ................... | 313/108 |
| 3,600,172 | 4/1971 | Land ................................ | 96/45.1 |
| 3,621,321 | 11/1971 | Williams et al. ................. | 313/108 A |
| 3,995,299 | 11/1976 | Partridge ......................... | 357/8 |
| 4,281,054 | 7/1981 | Horgan et al. ................... | 430/59 |
| 4,356,429 | 10/1982 | Tang ................................ | 313/503 |

OTHER PUBLICATIONS

*Proceeding of the IEEE*, Mar. 1978, "A Simple Organic Electroluminescent Diode", Williams et al.
*Thin Solid Films*, vol. 94, pp. 171-183, 1982, "Electrical Conduction & Low Voltage Blue Electroluminescence in Vacuum-Deposited Organic Films", by Vincett et al.

*Primary Examiner*—David K. Moore
*Assistant Examiner*—K. Wieder
*Attorney, Agent, or Firm*—Dana M. Schmidt

[57] ABSTRACT

Electroluminescent devices are disclosed comprising a hole-injecting zone and an adjacent organic luminescent zone, the device having a power conversion efficiency of at least $9 \times 10^{-5}$ w/w and said zones having a combined thickness no greater than about 1 micron.

9 Claims, 2 Drawing Figures

ORGANIC ELECTROLUMINESCENT DEVICES HAVING IMPROVED POWER CONVERSION EFFICIENCIES

FIELD OF THE INVENTION

This invention relates to electroluminescent devices that generate light in response to an electric signal, wherein organic compounds are the light-generating means.

BACKGROUND OF THE INVENTION

For organic electroluminescent devices to become fully competitive with their inorganic counterparts, it is desirable that their power conversion efficiencies be increased at competitive costs. The power conversion efficiency is defined as the ratio of power output to power input, usually watt per watt, and is a function of the driving voltage of the device. For driving voltages that utilize economical drive circuitry, that is, voltages no greater than 25 volts, power conversion efficiencies have been limited to no more than $1 \times 10^{-5}$ w/w in organic devices. Organic electroluminescent devices using thick films ($>5\mu$), or single crystals, have been produced with power conversion efficiencies greater than $10^{-5}$ w/w. However, because of their greater thickness, the voltage required to drive such devices is quite high ($\geq 100$ volts).

In order to reduce the driving voltage to no more than about 25 volts, thin-film electroluminescent devices are desirable, which as used herein means a device wherein the thickness of the active zones or layers, that is, the material between the electrodes, does not exceed about 1 micron. The thin film format has been particularly difficult to achieve in light of a pinholing problem. Pinholes are unacceptable because they short out the cell—see e.g., Dresner, RCA Review, Vol. 30, p 322ff (June 1969), and especially p. 326. To prevent formation of pinholes, a binder has been conventionally used in the coating formulations. Examples of such binders include addition polymers such as polystyrene, and condensation polymers such as polyesters. Although shorting of the cell may be avoided, the use of a binder is sometimes unsatisfactory. It requires the use of solvent coating manufacturing techniques, and the solvent of the one layer may also act as a solvent for the underlayer, thus preventing a sharp demarcation between layers. Although one could imagine a process of solvent-coating the one layer that needs a binder and then vapor depositing the layer(s) not needed a binder, a reverse sequence in which the luminescent layer is solvent-coated has not proven to be practical when the solvent affects the lower layer.

The cells described in commonly owned U.S. Application Serial No. 169,705, filed on July 17, 1980, by C. W. Tang entitled "Organic Electroluminescent Cell", now U.S. Pat. No. 4,356,429, are examples of markedly improved devices of the thin film format. Such cells have improved power conversion efficiencies by reason of reduced thickness of the luminescent zone, and of the use of an adjacent hole-injecting zone.

Although the cells of the aforesaid application have demonstrated the noted marked improvement over prior art cells, they have not achieved the levels of power conversion efficiencies that have been desired, that is, at least $9 \times 10^{-5}$ w/w or higher when using a driving voltage no greater than 25 volts. The porphyrinic compounds in the hole-injecting layer are colored and thus tend to undesirably absorb some of the light that is emitted by the cell. Also, the porphyrinic compounds appear to interfere with the efficient radiative recombination of holes and electrons needed to efficiently generate light output.

Thus, what has been needed prior to this invention is an electroluminescent, hereinafter, "EL", device that has power conversion efficiencies improved by at least one order of magnitude, i.e., to at least $9 \times 10^{-5}$ w/w, while maintaining the thin film format and reduced driving voltages.

SUMMARY OF THE INVENTION

In accordance with the present invention there is advantageously featured an organic electroluminescent device that has the sought-after improved power conversion efficiency as well as a thin film format wherein the combined thickness of the active zones does not exceed about $1\mu$.

It is another advantageous feature of the invention that the luminescent zone or the hole-injecting zone of such a device is manufacturable from an electron-transporting compound or from a hole-transporting compound, respectively, which in many embodiments of the invention is accomplished without a binder in the respective zone.

Still another advantageous feature of the invention is that compounds have been discovered for the hole-injecting layer that are substantially transparent to the generated radiation.

The aforesaid features of the invention result from the following more specific aspects of the invention: In accord with one aspect, an electroluminescent device is provided comprising, in sequence, an anode electrode, a hole-injecting zone, a luminescent zone, and a cathode electrode, wherein at least one of the electrodes transmits at least 80% of radiation having wavelengths longer than 400 nm. This device is improved to have a power conversion efficiency of at least $9 \times 10^{-5}$ w/w and said zones have a combined thickness of no greater than about 1 micron.

Most preferably, the luminescent zone of the aforesaid device comprises a electron-transporting compound that provides an electroluminescent quantum efficiency of at least about $5 \times 10^{-4}$ photons/electron, when used in a test device driven at no more than the lesser of (i) 25 volts and (ii) the voltage which produces the maximum power conversion efficiency of said device, the test device comprising (1) a hole-injecting zone consisting essentially of 1,1-bis(4-di-p-tolylaminophenyl)cyclohexane, such hole-injecting zone and said luminescent zone having a combined thickness of no more than $1\mu$, (2) an anode electrode that transmits at least 80% of radiation having wavelengths longer than 400 nm, and (3) an indium cathode.

Other advantageous features of the invention will become apparent upon reference to the following Description of the Preferred Embodiments when read in light of the attached drawings.

DESCRIPTION OF THE PREFERRED EMBODIMENTS

This invention is described particularly in connection with embodiments wherein the materials of the electroluminescent device are in layers or laminae, one on top of the other. In addition, the invention is applicable to an electroluminescent (hereinafter, "EL") cell or device wherein the hole-transporting material and the luminescent material are in zones, whether the zones are in layers or otherwise.

The device of this invention comprises a hole-injecting layer and a luminescent layer. The hole-injecting layer comprises a hole-transporting compound, while the luminescent layer comprises an electron-transporting compound.

We have discovered that there are certain electron-transporting compounds that produce EL quantum efficiency values in excess of $5 \times 10^{-4}$ photons/electron, when used in a cell driven and constructed as hereinafter described. Because of the direct relationship which occurs between power conversion efficiencies and EL quantum efficiencies, these compounds insure that for the driving voltage noted, the power conversion efficiency will be at least $9 \times 10^{-5}$ w/w. Because these compounds are readily deposited in a thin film format, a thin-film device is readily obtainable wherein the combined thickness of the active zones does not exceed $1\mu$.

As used herein, an electron-transporting compound is a compound that is reducible in an oxidationreduction reaction. It is those electron-transporting compounds producing at least $5 \times 10^{-4}$ EL quantum efficiency, as per the test hereinafter defined, that are particularly useful in this invention. (As is well known, the EL quantum efficiency simply equals the ratio of photons per second emitted from the cell, to the electrons per second measured in the external circuit. This efficiency is not to be confused with power conversion efficiency, which is defined in units of watt/watt.)

To determine whether an electron-transporting compound produces an EL quantum efficiency at least equal to $5 \times 10^{-4}$ photons/electron (or 0.05%), the following test is conducted:

An EL cell is constructed in the following sequence: an anode electrode that transmits at least 80% of radiation having wavelengths longer than 400 nm, a hole-injecting layer consisting essentially of 1,1-bis(4-di-p-tolylaminophenyl)cyclohexane, a layer of the electron-transporting compound in question, and an indium cathode, wherein the hole-injecting layer and the luminescent layer together do not exceed $1\mu$ in thickness. A driving voltage is applied, and is increased until either the maximum power conversion efficiency, or 25 volts, is reached, whichever occurs first. The maximum EL quantum efficiency is measured at this voltage.

Table I illustrates the EL quantum efficiencies for some useful electron-transporting compounds, when tested in the device constructed as noted and driven at the noted voltages. For each of these examples, the voltage of the maximum EL quantum efficiency was less than the 25-volt limit.

TABLE I

| Configuration | Maximum EL Quantum Efficiency* | Driving Voltage at Measuring Point |
|---|---|---|
| Nesatron TM anode/Epindolidione[1] (1500Å)/In cathode (a Comparative Example) | $2 \times 10^{-4}$ | 18 v |
| Nesatron TM anode/HI-1[2] (750Å)/E1[3] (750Å)/In cathode | $1 \times 10^{-2}$ | 20 v |
| Nesatron TM anode/HI-1 (750Å)/E2[4] (750Å)/In cathode | $8 \times 10^{-3}$ | 20 v |
| Nesatron TM anode/HI-1 (750Å)/E3[5] (750Å)/In cathode | $3 \times 10^{-3}$ | 15 v |
| Nesatron TM anode/HI-1 (750Å)/E4[6] (750Å)/In cathode | $3 \times 10^{-3}$ | 12.5 v |
| Nesatron TM anode/HI-1 (750Å)/E5[7] (750Å)/In cathode | $1.5 \times 10^{-3}$ | 24 v |
| Nesatron TM anode/HI-1 (750Å)/E6[8] (750Å)/In cathode | $5 \times 10^{-3}$ | 15 v |
| Nesatron TM anode/HI-1 (750Å)/E7[9] (750Å)/In cathode | $8 \times 10^{-3}$ | 14 v |

*Rounded off to one significant digit, except for E5.

[1] Epindolidione =

[2] HI-1 = 1,1-bis(4-di-p-tolylaminophenyl)cyclohexane

[3] E1 =

[4,4'-bis[5,7-di(2-methyl-2-butyl)-2-benzoxazolyl]stilbene]

[4] E2 =

[2,5-bis[5,7-di(2-methyl-2-butyl)-2-benzoxazolyl]thiophene]

[5] E3 =

[2,2'-(1,4-phenylenedivinylene)bisbenzothiazole]

[6] E4 =

[2,2'-(4,4'-biphenylene)bisbenzothiazole]

TABLE I-continued

[7] E5 = bis(8-hydroxyquinolino)magnesium

[8] E6 =

[2,5-bis[5-(α, α-dimethylbenzyl)-2-benzoxazolyl]thiophene]

[9] E7 =

[2,5-bis[5,7-di(2-methyl-2-butyl)-2-benzoxazolyl]-3,4-diphenyl-thiophene]

Hole-transporting compounds of the hole-injecting layer, as used herein, are compounds which, when disposed between two electrodes to which a field is applied, and a hole is injected from the anode, permit adequate transport of holes to the cathode electrode. More specifically, a compound is defined to be hole-transporting if it has a hole mobility factor of at least $10^{-6}$ cm$^2$/volt-sec when a layer is disposed between electrodes to which an electric field of $10^4$ to $10^6$ volts/cm is applied. It has been found that the most preferred hole-transporting compounds are aromatic amines that are readily and reversibly oxidizable.

Most preferably, the hole-injecting layer is the transparent portion of the active layers, because it is adjacent to the transparent electrode. Thus, the hole-transporting compound is also preferably at least 90% transmissive at 400 nm, or longer, wavelengths. That is, the hole-transporting compound is preferably essentially colorless.

Preferred examples of useful hole-transporting compounds that have the afore-noted light transmittance include amines that are solid at room temperature and in which at least one nitrogen atom is tri-substituted with substituents at least one of which is aryl. As will be apparent from the examples that follow, "aryl" substituents in hole-transporting compounds includes substituted aryl as well as unsubstituted aryl, such as phenyl and methylphenyl. Examples of useful substituents include alkyl of 1 to 5 carbon atoms, for example, methyl, ethyl, propyl, and the like; halo, such as chloro, fluoro and the like; and alkoxy having 1 to 5 carbon atoms, for example, methoxy, ethyoxy, propoxy, and the like.

It is noted that some of the hole-transporting compounds, as well as some of the electron-transporting compounds, of the invention have the additional property of being thin-film-forming compounds. As used herein, a compound is "thin-film-forming" if, when the material is applied by itself to a support such as an electrode, in a thickness no greater than 0.5μ, it forms a layer that is substantially free of pinholes. Reference to a compound being thin-film-forming does not necessarily mean, however, that no more than 0.5μ is present. The property of thin-film-forming is useful in that binders can be omitted in both of the layers, if one of the layers of the active zones comprises such a thin-film-forming compound. Alternatively, a binder which does not otherwise hinder the light-producing recombination of holes and electrons, is also useful in the invention.

Useful examples of compounds capable of forming thin films as defined are set forth hereinafter. Particularly useful examples include compounds containing either a heterocyclic or carbocyclic nucleus and at least two aliphatic chains of 3 or more carbon atoms, or at least two moieties each of which is (a) rotatable about a single bond and (b) contains at least three aromatic or saturated carbocyclic rings.

For example, hole-transporting compounds that are thin-film-forming include those having the structure wherein $Q^1$ and $Q^2$ are individually moieties containing nitrogen and at least 3 carbocyclic rings at least one of which is aromatic, for example, phenyl. The carbocyclic rings can be saturated rings, for example, cyclohexyl and cycloheptyl; and G is a linking group such as cycloalkylene, e.g., cyclohexylene; arylene such as phenylene; alkylene, such as methylene, ethylene, propylene and the like; or a carbon-to-carbon bond. Specific individual examples within structure (a) include 1,1-bis(4-di-p-tolylaminophenyl)-4-phenylcyclohexane having the structure

1,1-bis(4-di-p-tolylaminophenyl)cyclohexane; and compounds having the structure wherein n is an integer of from 2 to 4, e.g., 4,4'''-bis(diphenylamino)quadriphenyl.

Still other hole-transporting compounds contemplated as being useful include those listed in U.S. Pat. No. 4,175,960, line 13 of column 13 to line 42 of column 14, for example, bis(4-dimethylamino-2-methylphenyl)-phenylmethane and N,N,N-tri(p-tolyl)amine.

With respect to the thin-film forming electron-transporting compounds, preferred examples include optical brighteners. Most preferred are those optical brighteners having the structural formula wherein $R^1$, $R^2$, $R^3$ and $R^4$ are individually hydrogen; saturated aliphatic of from 1 to 10 carbon atoms, for example, propyl, t-butyl, heptyl, and the like; aryl of from 6 to 10 carbon atoms, for example, phenyl and naphthyl; or halo such as chloro, fluoro and the like; or $R^1$ and $R^2$ or $R^3$ and $R^4$ taken together comprise the atoms necessary to complete a fused aromatic ring optionally bearing at least one saturated aliphatic of from 1 to 10 carbon atoms, such as methyl, ethyl, propyl and the like;

$R^5$ is a saturated aliphatic of from 1 to 20 carbon atoms, such as methyl, ethyl, n-eicosyl, and the like; aryl of from 6 to 10 carbon atoms, for example, phenyl and naphthyl; carboxyl; hydrogen; cyano; or halo, for example, chloro, fluoro and the like; provided that in formula (b) at least two of $R^3$, $R^4$ and $R^5$ are saturated aliphatic of from 3 to 10 carbon atoms, e.g., propyl, butyl, heptyl and the like;

Z is —O—, —NH—, or —S—;
Y is m is an integer of from 0 to 4;
n is 0, 1, 2 or 3;
$R^6$ is arylene of from 6 to 10 carbon atoms, for example, phenylene and naphthylene; and
Z' and Z" are individually N or CH. As used herein, "aliphatic" includes substituted aliphatic as well as unsubstituted alipnatic. The substituents in the case of substituted aliphatic include alkyl of from 1 to 5 carbon atoms, for example, methyl, ethyl, propyl and the like; aryl of from 6 to 10 carbon atoms, for example, phenyl and naphthyl; halo, such as chloro, fluoro and the like; nitro; and alkoxy having 1 to 5 carbon atoms, for example, methoxy, ethoxy, propoxy, and the like.

Specific preferred examples of optical brighteners include 2,5-bis(5,7-di-t-pentyl-2-benzoxazolyl)-1,3,4-thiadiazole; 4,4'-bis(5,7-di-t-pentyl-2-benzoxazolyl)stilbene; 2,5-bis(5,7-di-t-phenyl-2-benzoxazolyl)thiophene; 2,2'-(p-phenylenedivinylene)bisbenzothiazole; 4,4'-bis(2-benzoxazolyl)biphenyl; 2,5-bis[5-(α,α-dimethylbenzyl)-2-benzoxazolyl]thiophene; 4,4'-bis[5,7-di-(2-methyl-2-butyl)-2-benzoxazolyl]-stilbene; and 2,5-bis[5,7-di-(2-methyl-2-butyl)-2-benzoxazolyl]-3,4-diphenylthiophene.

Still other optical brighteners that are contemplated to be useful are listed in Vol. 5 of *Chemistry of Synthetic Dyes,* 1971, pages 628–637 and 640. Those that are not already thin-film-forming can be rendered so by attaching an aliphatic moiety to one or both end rings. Such additional useful optical brighteners include, for example, named 2-{2-[4-(2-benzimidazolyl)phenyl]vinyl}benzimidazole, named 5-methyl-2-{2-[4-(5-methyl-2-benzoxazolyl)-phenyl]vinyl}benzoxazole, named 2,5-bis(5-methyl-2-benzoxazolyl)thiophene, named 2-[2-(4-carboxyphenyl)vinyl]benzimidazole, and named 2-[2-(4-chlorophenyl)vinyl]naphth[1,2-d]oxazole.

Still other useful thin-film-forming electron transporting compounds include metal complexes of 8-hydroxyquinoline, where the metal is Zn, Al, Mg, or Li.

If one of the active layers is thin-film-forming, then, as will be readily apparent, the other need not be thin-film-forming as pinholing will not short out the device. For example, a useful device comprises the hole-injecting layer comprising a thin-film-forming compound as described above, and the luminescent layer consisting of a compound that is not thin-film-forming, for example, 1,1,4,4-tetraphenyl-1,3-butadiene.

As is apparent from Table I above, useful anode electrodes include coated glass anodes available from PPG Industries under the trademark "Nesatron" and useful cathode electrodes include indium. Any conventional anode and cathode electrode is useful if it has the proper work-function value. For example, the anode should have a high work-function. Other useful anode examples include glass coated with any semitransparent high work-function conductive material, e.g., indium tin oxide, tin oxide, nickel, or gold. Preferably, such anode electrodes have a sheet resistance of about 10 to 1000 ohms/square and an optical transmittance of about 80% for wavelengths longer than 400 nm. Such high optical transmittance, when combined with the hole-transporting compound's transmittance of at least 90%, insures the superior power conversion efficiencies that are characteristic of devices made in accordance with the present invention.

Other useful cathode examples include other metals having a low work-function, such as silver, tin, lead, magnesium, manganese, aluminum and the like, whether or not the metal has high transmittance to the luminescence generated by the device.

Figure 1:
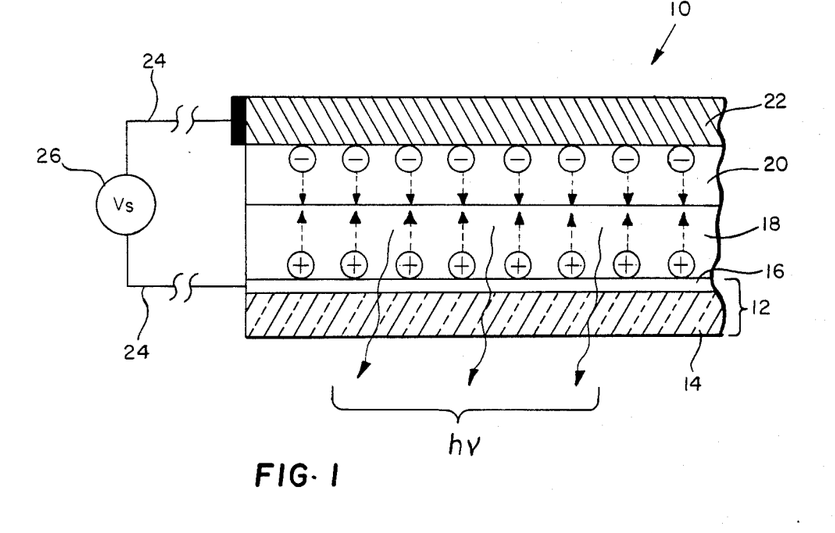
FIG. 1 is a partially schematic section view of a device of the invention connected to a power source.

FIG. 1 illustrates an electroluminescent device 10 prepared in accordance with the invention. It comprises an anode electrode 12 comprising a glass support 14 coated with a semitransparent coating 16 of indium tin oxide on which is disposed a hole-injecting layer 18. A luminescent layer 20 is disposed on layer 18, one or both layers 18 and 20 comprising a thin-film-forming compound. Cathode 22 is disposed on layer 20, and lead wires 24 connect the device to a power source 26. When source 26 is turned on, holes generated at anode 12 are transported to the interface between layers 18 and 20 wherein they combine with electrons transported from cathode 22, generating visible radiation hν.

When source 26 is operated at a maximum power-point voltage of the device 10, e.g., between 15 and 25 volts, the maximum power conversion efficiency is at least $9 \times 10^{-5}$ w/w. In some cases this efficiency has been found to be as high as $2 \times 10^{-3}$. As a result of the improved power conversion efficiencies, the devices of the invention have been found to produce maximum brightnesses as high as 1700 cd/m² (500 ft-lamberts).

The EL device of the invention is constructed using conventional processes. That is, each of the hole-injecting layer, the luminescent layer and cathode is applied via solution coating or evaporation, with the hole-injecting layer preferably being formed first. If the useful solvents for the luminescent layer are also good solvents for the hole-injecting layer, then evaporation is preferred for the formation of the luminescent layer. As used herein, "evaporation" includes all forms of deposition from the vapor phase, including those done under vacuum.

EXAMPLES

The following examples further illustrate the invention. In these examples, the maximum brightness is measured at a voltage just short of that which produces irreversible breakdown. It is for this reason that some examples state a voltage for such brightness that exceeds the preferred 25 v limit on the driving voltage.

EXAMPLE 1

An electroluminescent device, hereinafter, "cell", similar to that of FIG. 1 was prepared as follows:

(1) To form the anode electrode, Nesatron TM glass was first polished with 0.05μ alumina abrasive for a few minutes, followed by ultrasonic cleaning in a 1:1 (v) mixture of isopropyl alcohol and distilled water. It was then rinsed with isopropyl alcohol and blown dry with nitrogen. Finally, it was ultrasonically cleaned in toluene and blown dry with nitrogen before use.

(2) 1,1-Bis(4-di-p-tolylaminophenyl)cyclohexane (HI-1) was deposited on the Nesatron TM glass using conventional vacuum-deposition techniques: The material was evaporated from an electrically-heated tantalum boat at a temperature of approximately 320° C., and at a system pressure of about $5 \times 10^{-5}$ torr. The thickness of the resulting HI-1 film which was deposited on the Nesatron TM glass was about 750Å.

(3) 4,4'-Bis(5,7-di-t-pentyl-2-benzoxazolyl)-stilbene (E1) was then deposited on top of the HI-1 layer using the same techniques described in (2), but employing a source temperature of about 350° C. The thickness of the E1 layer was also about 750Å.

(4) Indium was then deposited on top of the E1 film through a shadow mask. The area of the In electrode was 0.1 cm², which also defined the active area of the electroluminescent cell.

The completed cell emitted blue-green light when biased with the Nesatron TM glass electrode positive. The emitted light had a maximum emission at 520 nm. The maximum brightness achieved was 340 cd/m² at a current density of about 140 mA/cm² when the applied voltage was 22 volts. The maximum power conversion efficiency was about $1.4 \times 10^{-3}$ w/w and the maximum electroluminescent quantum efficiency was about $1.2 \times 10^{-2}$ photons/electron when driven at 20 volts.

EXAMPLE 2

Use of Hole-Injecting Layer That Is Not Thin-Film-Forming

An electroluminescent cell was prepared as described in Example 1, except that N,N,N-tri(p-tolyl)amine was used as the hole-injecting layer in place of HI-1. This amine compound has the structure

The cell was prepared in the same manner as described for Example 1, except that the source temperature for the amine evaporation was 120° C. The thickness was about 750Å. Upon application of 30 volts to this cell, a current density of about 40 mA/cm$^2$ and a maximum brightness of 102 cd/m$^2$ was obtained. The emitted light was again blue-green, with the maximum emission at 520 nm. The maximum power conversion efficiency was $8.1 \times 10^{-4}$ w/w and the maximum EL quantum efficiency was $6.9 \times 10^{-3}$ photons/electron when driven at 20 volts.

These results demonstrated that if the luminescent layer was free of pinholes because it comprised a thin-film-forming compound, then the hole-injecting layer did not have to be a thin-film-forming compound nor contain a binder.

EXAMPLE 3

Alternate Materials for Luminescent Layer

An electroluminescent cell was prepared as in Example 1, except that the following optical brightener was used as the luminescent layer:

[2,5-bis(5,7-di-t-pentyl-2-benzoxazolyl)-1,3,4-thiadiazole].

The cell was prepared in the same manner described for Example 1, except that the source temperature for evaporation of the optical brightener was 260° C. The emitted light was orange, with the maximum emission at 590 nm. The maximum brightness obtained was about 340 cd/m$^2$ at 30 volts and 40 mA/cm$^2$. The maximum power conversion efficiency was $1.5 \times 10^{-3}$ w/w and the maximum EL quantum efficiency was $1.4 \times 10^{-2}$ photons/electron when driven at 20 volts.

EXAMPLE 4

Alternate Materials for Luminescent Layer

An electroluminescent cell was prepared as in Example 1 above except that 2,2'-(p-phenylenedivinylene)bis-benzothiazole (E3) was used as the luminescent layer and was evaporated at 300° C:

E3

The cell, Nesatron TM /HI-1/E3/In, emitted green light with maximum emission at 560 nm. The maximum brightness obtained was 340 cd/m$^2$ at 17.5 volts and 200 mA/cm$^2$. The maximum power conversion efficiency was $4 \times 10^{-4}$ w/w, and the maximum electroluminescent quantum efficiency was $3 \times 10^{-3}$ photons/electron when driven at 15 volts.

EXAMPLE 5

Alternate Materials for Luminescent Layer

An electroluminescent cell was prepared as described in Example 1 above, except that 2-(4-biphenylyl)-6-phenylbenzoxazole (PBBO) was used as the luminescent layer, instead of E1, and was evaporated at 200° C.

PBBO

The cell, Nesatron TM /HI-1/PBBO/In, emitted whitish-blue light. The maximum brightness obtained was about 34 cd/m$^2$ at 25 volts and 50 mA/cm$^2$. The maximum power conversion efficiency was $9.5 \times 10^{-5}$ w/w, and the maximum electroluminescent quantum efficiency was $8 \times 10^{-4}$ photons/electron when driven at 20 volts.

EXAMPLES 6 AND 7

Alternate Materials for Luminescent Layer

An electroluminescent cell was prepared as described for Example 1, except that the luminescent layer comprised 2,5-bis[5-(α,α-dimethylbenzyl)-2-benzoxazolyl]-thiopene (Ex. 6), and 2,5-bis[5,7-di-(2-methyl-2-butyl)-2-benzoxazolyl]-3,4-diphenylthiophene (Ex. 7), instead of E1, evaporated at a temperature of 340° C. Table II sets forth the results.

TABLE II

| | Emitted Light | | | Max. Power Conversion Efficiency | Max. EL Quantum Efficiency | Efficiency Determination Driving Voltage |
|---|---|---|---|---|---|---|
| Ex. | Color | Max. Emission | Max. Brightness | | | |
| 6 | green | 530 nm | 680 cd/m$^2$ at 19 v | $7 \times 10^{-4}$ w/w | $5 \times 10^{-3}$ photons/ | 15 v |

TABLE II-continued

| Ex. | Emitted Light Color | Max. Emission | Max. Brightness | Max. Power Conversion Efficiency | Max. EL Quantum Efficiency | Efficiency Determination Driving Voltage |
|---|---|---|---|---|---|---|
| 7 | " | " | and 150 mA/cm² 1700 cd/m² at 20 v and 300 mA/cm² | $1.4 \times 10^{-3}$ w/w | $8.4 \times 10^{-3}$ photons/ electron | 14 v |

EXAMPLE 8

Electron-Transporting Compound That is Not Thin-Film-Forming

An electroluminescent cell was prepared as in Example 1 above except that 1,1,4,4-tetraphenyl-1,3-butadiene (TPB) was used as the luminescent layer.

TPB

The source temperature for the TPB sublimation was 210° C. The cell emitted blue light with maximum emission at 450 nm. The maximum brightness obtained was about 102 cd/m² at 20 volts and 200 mA/cm². The maximum power conversion efficiency was about $2 \times 10^{-4}$ w/w, and the maximum electroluminescent quantum efficiency was $1.2 \times 10^{-3}$ photons/electron when driven at 15 volts. This cell was operational in spite of the non-uniform and non-film-forming nature of the evaporated TPB layer, which has the appearance of a mosaic of small clusters when viewed under a microscope.

EXAMPLES 9 AND 10

Use of Metal Complexes of 8-hydroxyquinoline as the Electron-Transporting Compound An electroluminescent cell was prepared as in Example 1, except that bis(8-hydroxyquinolino)aluminum (Ex. 9), and bis(8-hydroxyquinolino)magnesium having the structure (Ex. 10)

respectively, were used as the luminescent layer. The process conditions were as described in Example 1, except that the source temperature for the metal complexes was 330° C., Ex. 9, and 410° C., Example 10, respectively. Table III sets forth the results.

TABLE III

| Ex. | Color of Emitted Light | Wavelength of Max. Emission | Maximum Brightness (cd/m²) | Maximum Power Conversion Efficiency (w/w) | Maximum EL quantum Efficiency | Driving Voltage |
|---|---|---|---|---|---|---|
| 9 | green | 515 nm | 340 at 15 volts & 50 mA/cm² | $8.2 \times 10^{-4}$ | $5.8 \times 10^{-3}$ photons/ electron | 15 v |
| 10 | green | 548 nm | 340 at 24 volts & 100 mA/cm² | $1.4 \times 10^{-4}$ | $1.5 \times 10^{-3}$ photons/ electron | 24 v |

Figure 2:
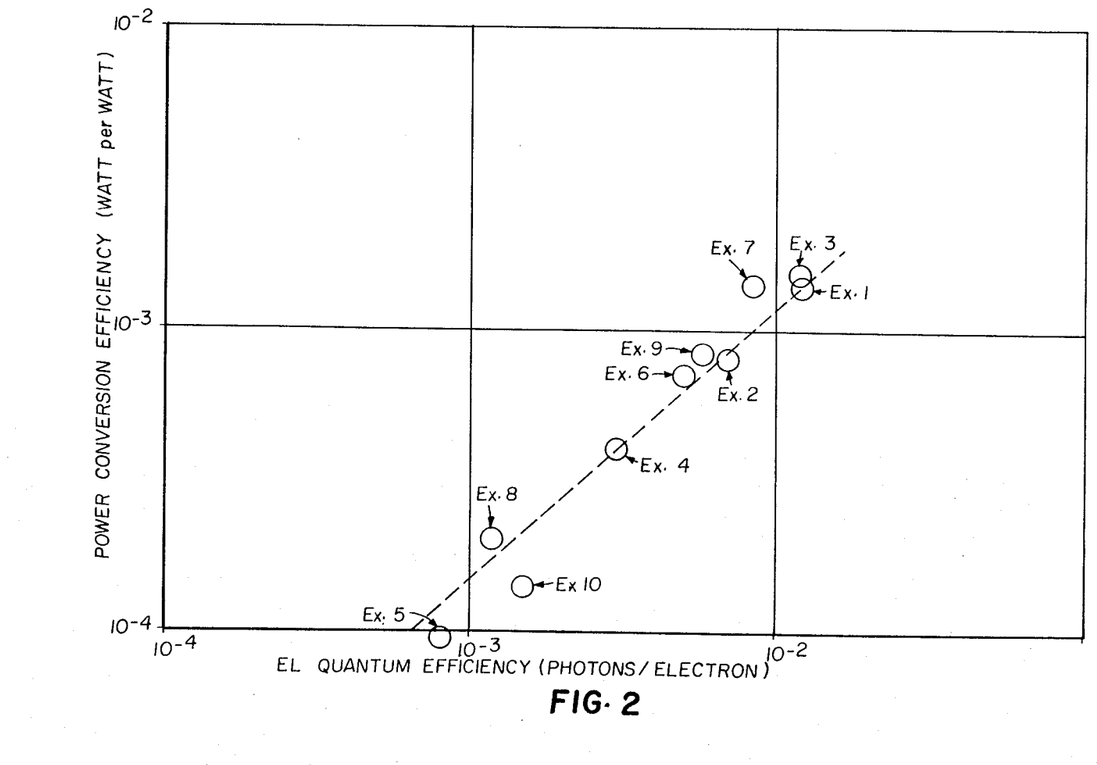
FIG. 2 is a log-log graph of power conversion efficiencies vs. electroluminescent quantum efficiencies for devices produced in accordance with the invention.

The efficiencies listed in the aforesaid examples have been plotted in FIG. 2 for convenience. The dotted line of FIG. 2 is intended only to indicate the trend, and does not represent a best fit by any method. The data therein illustrated is approximately linear, in accordance with the relationship log (power conversion efficiency) = log (EL quantum efficiency) + log K where K is the intercept value and is a factor controlled in part by the driving voltage. As the driving voltage (source 26 in FIG. 1) goes up in value, the curve of FIG. 2 shifts downwardly. Thus, at higher driving voltages, the same EL quantum efficiencies will tend to no longer produce the desired power conversion efficiency of at least $9 \times 10^{-5}$ w/w.

The invention has been described in detail with particular reference to preferred embodiments thereof, but it will be understood that variations and modifications can be effected within the spirit and scope of the invention.

What is claimed is:

1. In an electroluminescent device comprising, in sequence, an anode electrode, a hole-injecting zone, an organic luminescent zone, and a cathode electrode, at least one of said electrodes being capable of transmitting at least 80% of radiation having wavelengths longer than 400 nm, the improvement wherein said luminescent zone comprises an electron-transporting compound that provides a maximum electroluminescent quantum efficiency of at least about $5 \times 10^{-4}$ photons/electron, when used in a test device driven at no more than the lesser of (i) 25 volts and (ii) the voltage which produces the maximum power conversion efficiency of said device, said test device comprising (1) a hole-injecting zone consisting essentially of 1,1-bis-(4-di-p-tolylaminophenyl)cyclohexane, said hole-injecting zone and said luminescent zone having a combined thickness of no more than 1 micron, (2) an anode electrode that transmits at least 80% of radiation having wavelengths longer than 400 nm, and (3) an indium cathode, and wherein said device has a power conversion efficiency of at least $9 \times 10^{-5}$ w/w and said zones have a combined thickness that is no greater than about 1 micron.

2. A device as defined in claim 1, wherein said electron-transporting compound is an optical brightener.

3. A device as defined in claim 2, wherein said optical brightener has a structural formula selected from the class consisting of (a)

and (b)

wherein

(1) $R^1$, $R^2$, $R^3$ and $R^4$ are individually hydrogen, saturated aliphatic of from 1 to 10 carbon atoms, aryl of from 6 to 10 carbon atoms, or halo, or (2) $R^1$ and $R^2$ or $R^3$ and $R^4$ taken together comprise the atoms necessary to complete a fused aromatic ring;

$R^5$ is saturated aliphatic of from 1 to 20 carbon atoms, aryl of from 6 to 10 carbon atoms, carboxyl, hydrogen, cyano or halo; provided that in formula (b) at least two of $R^3$, $R^4$ and $R^5$ are saturated aliphatic of from 3 to 10 carbon atoms;

Z is —O—, —NH—, or —S—;

Y is m is an integer of from 0 to 4;

n is 0, 1, 2 or 3;

$R^6$ is arylene of from 6 to 10 carbon atoms; and

Z' and Z" are individually N or CH.

4. A device as defined in claim 2, wherein said optical brightener is selected from the group consisting of 4,4'-bis(5,7-di-t-pentyl-2-benzoxazolyl)stilbene; 2,5-bis(5,7-di-t-pentyl-2-benzoxazolyl)-1,3,4-thiadiazole; 2,5-bis(5,7-di-t-phenyl-2-benzoxazolyl)thiophene; 2,2'-p-(phenylenedivinylene)bisbenzothiazole; 4,4'-bis(2-benzoxazolyl)biphenyl; 2,5-bis[5-(α,α-dimethylbenzyl)-2-benzoxazolyl]-thiophene; 4,4'-bis[5,7-di-(2-methyl-2-butyl)-2-benzoxazolyl]-stilbene; and 2,5-bis[5,7-di-(2-methyl-2-butyl)-2-benzoxazolyl]-3,4-diphenylthiophene.

5. A device as defined in claim 1, wherein said electron-transporting compound is a metal complex of 8-hydroxyquinoline.

6. A device as defined in claim 5, wherein the metal of said metal complex is selected from the group consisting of Zn, Al, Mg and Li.

7. In an electroluminescent device comprising, in sequence, an anode electrode, a hole-injecting zone, an organic luminescent zone, and a cathode electrode, at least one of said electrodes being capable of transmitting at least 80% of radiation having wavelengths longer than 400 nm, the improvement wherein said hole-injecting zone comprises an amine that transmits at least about 90% of radiation having wavelengths greater than 400 nm, at least one nitrogen atom of the amine being trisubstituted with substituents at least one of which is aryl, said amine being solid at room temperature and having the structural formula wherein $Q^1$ and $Q^2$ are individually moieties containing nitrogen and at least 3 carbocyclic rings at least one of which is aromatic, and, G is a linking group or a carbon-to-carbon bond, whereby said amine is thin-film-forming.

8. In an electroluminescent device comprising, in sequence, an anode electrode, a hole-injecting zone, an organic luminescent zone, and a cathode electrode, at least one of said electrodes being capable of transmitting at least 80% of radiation having wavelengths longer than 400 nm, the improvement wherein said hole-injecting zone comprises an amine selected from the group consisting of
bis(4-dimethylamino-2-methylphenyl)phenylmethane; N,N,N-tri(p-tolyl)amine;
1,1-bis(4-di-p-tolylaminophenyl)cyclohexane; and
1,1-bis(4-di-p-tolylaminophenyl)-4-phenylcyclohexane.

9. In an electroluminescent device comprising, in sequence, an anode electrode, a hole-injecting zone, an organic luminescent zone, and a cathode electrode, at least one of said electrodes being capable of transmitting at least 80% of radiation having wavelengths longer than 400 nm, the improvement wherein said hole-injecting zone comprises 1,1-bis(4-di-p-tolylaminophenyl)cyclohexane;

and said luminescent zone comprises 2,5-bis(5,7-di-t-pentyl-2-benzoxazolyl)-1,3,4-thiadiazole;

said two zones having a combined thickness no greater than about 1 micron.

* * * * *